(12) United States Patent
Daviet

(10) Patent No.: US 6,312,555 B1
(45) Date of Patent: Nov. 6, 2001

(54) THIN FILM ELECTROSTATIC SHIELD FOR INDUCTIVE PLASMA PROCESSING

(75) Inventor: Jean-François Daviet, Cran-Gevrier (FR)

(73) Assignee: CTP, Inc., San Jose, CA (US)

(*) Notice: Subject to any disclaimer, the term of this patent is extended or adjusted under 35 U.S.C. 154(b) by 0 days.

(21) Appl. No.: 09/528,562

(22) Filed: Mar. 20, 2000

Related U.S. Application Data

(63) Continuation of application No. 08/926,873, filed on Sep. 10, 1997, now Pat. No. 6,056,848.
(60) Provisional application No. 60/027,013, filed on Sep. 11, 1996.

(51) Int. Cl.$^7$ ................................................ H05H 1/00
(52) U.S. Cl. .................. 156/345; 118/723 I; 118/723 IR
(58) Field of Search ................. 156/345; 118/723 IR, 118/723 I

(56) References Cited

U.S. PATENT DOCUMENTS

| | | | |
|---|---|---|---|
| 4,918,031 | 4/1990 | Flamm et al. | 437/225 |
| 4,948,458 | 8/1990 | Ogle | 156/643 |
| 5,234,529 | 8/1993 | Johnson | 156/345 |
| 5,277,751 | 1/1994 | Ogle | 156/643 |
| 5,280,154 | 1/1994 | Cuomo et al. | 219/121.52 |
| 5,368,710 | 11/1994 | Chen et al. | 204/192.32 |
| 5,534,231 | 7/1996 | Savas | 216/67 |
| 5,540,800 | 7/1996 | Qian | 156/345 |
| 5,554,223 | 9/1996 | Imahashi | 118/723 I |
| 5,556,521 | 9/1996 | Ghanbari | 204/192.32 |
| 5,565,074 | 10/1996 | Qian et al. | 204/298.08 |
| 5,571,366 | 11/1996 | Ishii et al. | 156/345 |
| 5,614,055 | 3/1997 | Fairbairn et al. | 156/345 |
| 5,696,428 | 12/1997 | Pasch | 315/111.21 |
| 5,779,849 | 7/1998 | Blalock | 156/345 |
| 5,811,022 | 9/1998 | Savas et al. | 216/68 |
| 6,056,848 | * 5/2000 | Daviet | 156/345 |

FOREIGN PATENT DOCUMENTS

| | | | |
|---|---|---|---|
| 0 607 797 A1 | 7/1994 | (EP) | H01J/37/32 |
| WO96/15545 | 5/1996 | (WO) | H01J/37/32 |
| WO97/08734 | 6/1997 | (WO) | H01J/37/32 |

OTHER PUBLICATIONS

*The Hundred Year History of Induction Discharges*, H. Eckert, Proc. $2^{nd}$ Annual Internat'l Conference on Plasma Chemistry and Technology, Herman Boenig, Ed., Techromic Publ., Lancaster, PA 1986, pp. 171–202.

* cited by examiner

*Primary Examiner*—Thi Dang
(74) *Attorney, Agent, or Firm*—Wilson Sonsini Goodrich & Rosati

(57) ABSTRACT

A plasma reactor and methods for processing semiconductor substrates are described. An induction coil inductively couples power into the reactor to produce a plasma. A thin electrostatic shield is interposed between the induction coil and plasma to reduce capacitive coupling. The shield is electromagnetically thin such that inductive power passes through the shield to sustain the plasma while capacitive coupling is substantially attenuated. Reducing capacitive coupling reduces modulation of the plasma potential relative to the substrate and allows for more controllable processing.

28 Claims, 3 Drawing Sheets

THIN FILM ELECTROSTATIC SHIELD FOR INDUCTIVE PLASMA PROCESSING

REFERENCE TO RELATED APPLICATION

The present application is a continuation of U.S. application Ser. No. 08/926,873 filed Sep. 10, 1997, now U.S. Pat. No. 6,056,848 which claims priority from provisional application Ser. No. 60/027,013, filed Sep. 11, 1996. Application Ser. No. 08/926,873 and provisional application Ser. No. 60/027,013 are hereby incorporated by this reference in their entirety.

BACKGROUND

1. Field of the Invention

The field of the present invention relates in general to plasma reactors and processes typically used to process semiconductor substrates or the like. More particularly, the field of the invention relates to a shielded plasma reactor in which the plasma is generated primarily by inductively coupled power.

2. Background

The era of microelectronics, and more specifically of Very Large Scale Integration, has been built in large part around vacuum processing of semiconductors to obtain Integrated Circuits. One of the contributors in this field of vacuum processing, which enabled the development and success of today's semiconductor industry, is undoubtedly the outstanding parallel development of plasma tools and of related processing techniques. The plasma-based equipment market is a multi-billion dollar annual business, be it for thin film deposition, etching or even ion implantation.

The history of plasma etching is relatively short, starting only around twenty years ago. The first commercially available equipment featured a basic diode-like configuration. The plasma was generated in a vacuum chamber between two flat electrodes. One of the electrodes was typically used as a wafer susceptor, and was also usually connected to a high-frequency power supply. The other electrode was typically grounded, although in some configurations the second electrode was connected to a high frequency power supply instead of or in addition to the first electrode. This configuration was very successful at the time, but important technological limitations started to become evident in the early eighties. As integrated circuit geometry continued to shrink dramatically, the semiconductor industry sought to develop plasma equipment capable of producing dense plasmas with low energy ions. A dense plasma is important in order to achieve a high rate of processing, while low energy ions are important to avoid damaging small integrated circuit features which are susceptible to damage from bombardment of high energy ions. In order to produce a high density, low ion energy plasma, it is desirable to de-couple the control of plasma density from the control of ion energy in a plasma.

The first serious generation of decoupled, or advanced, plasma sources that appeared in the eighties relied on a microwave power source and featured a special magnet arrangement (technology known as Electronic Cyclotron Resonance, or ECR) capable of delivering a high plasma density without high energy ion bombardment of the semiconductor wafer. The usefulness of conventional ECR to address the evolving needs of the semiconductor industry is limited, however, mainly because of the complexity and very limited operating pressure range of conventional ECR.

A more promising approach has more recently emerged based upon the conventional Inductively Coupled Plasma, or ICP, which was originally invented at the end of the 19th century. Modern ICP sources, which have been improved and adapted for use in semiconductor processing, appear to provide a technology with the potential to meet the needs of the semiconductor industry well into the next decade. While ICP and ECR both provide high density, low ion energy plasmas, ICP allows a drastically wider pressure range to be used for processing. The pressure range for typical ICP sources ranges from about 0.5 mtorr to about 1 torr, whereas typical ECR sources are limited to an operating range of about 0.5 mtorr to about 5 mtorr. Consequently, ICP is suitable for a very wide range of applications that intrinsically require very different process pressures—from low pressure, fine pattern anisotropic etching to high pressure, isotropic etching.

Nevertheless, some conventional ICP sources suffer from a disadvantage in that they are prone to generate a significant amount of energetic ions. This is caused by the fact that the induction coil used to inductively couple energy into the plasma also causes some capacitive coupling of electromagnetic energy between the metal coil and the plasma (a phenomenon called parasitic capacitive coupling of the ICP inductor). In a typical ICP reactor, an induction coil surrounds a plasma production chamber below which a semiconductor substrate is placed for processing. Radio frequency power is applied to the induction coil and thereby inductively coupled into the plasma production chamber. The inductively coupled power accelerates ions circumferentially in the plasma substantially parallel to the semiconductor substrate. While inductively coupled power from the induction coil tends to accelerate ions in a plane parallel to the semiconductor substrate, the parasitic capacitive coupling tends to accelerate ions radially outward from the plasma which causes high energy ions to bombard the semiconductor substrate below the plasma. This problem is described in detail in U.S. Pat. No. 5,534,231 the disclosure of which is hereby incorporated herein by reference in its entirety.

This parasitic capacitive coupling can be substantially blocked by using a split electrostatic shield, also known as a split Faraday shield, positioned between the induction coil and the dielectric plasma chamber wall. The shield substantially blocks capacitive coupling while allowing inductive coupling of power into the plasma. Conventional split electrostatic shields typically comprise metal plates or a metal cylinder forming longitudinal slits transverse to the induction coil. The metal body of the shield blocks capacitive coupling, while the slits allow inductively coupled power to penetrate the shield. The slits prevent circumferential current loops from forming in the shield which would otherwise substantially prevent the penetration of the inductive electric field. Such electrostatically shielded ICP reactors are described in U.S. Pat. No. 4,918,031, U.S. Pat. No. 5,234,529 and U.S. Pat. No. 5,534,231, each of which is hereby incorporated herein by reference in its entirety. The excellent performance of such electrostatically shielded ICP sources demonstrates the promising potential of this technology for use in future semiconductor plasma processing equipment. Nevertheless, conventional split electrostatic shields are not ideal for all plasma processing. The slits allow some capacitive coupling through the slits which may in turn cause non-uniform power deposition in the plasma. In addition, conventional electrostatic shields typically comprise relatively complex, bulky and expensive solid-metal structures that must be fitted and supported around the outside of the dielectric ICP chamber wall.

What is needed is an electrostatic shield for ICP semiconductor processing reactors which provides more uniform and continuous shielding around the plasma. What is also need is an electrostatic shield that provides improved shielding of capacitive electric fields while allowing virtually unimpeded penetration of inductive electric fields. Preferably such an improved shield will be inexpensive and easy to manufacture and deploy.

SUMMARY OF THE INVENTION

One aspect of the present invention provides a thin film electrostatic shield for an inductively coupled plasma source for use in plasma processing. The thin film electrostatic shield provides a thin layer of conductive material between a source of inductively coupled power and a plasma. The conductive material is capable of blocking a desired amount of parasitic capacitive coupling from the power source or other source of capacitive power. In particular embodiments, a continuous thin film electrostatic shield (without slits or gaps) may be used between the source of capacitive power and the plasma, providing virtually complete capacitive shielding of the plasma. In other embodiments, the shield may contain slits or gaps to allow a desired amount of capacitive coupling. The slits or gaps do not have to be arranged transverse to the induction electric field as with conventional split electrostatic shields. Rather gaps can be arranged in any variety of patterns. For instance, small holes or gaps may be uniformly distributed around the shield to allow more uniform capacitive power deposition in the plasma.

The electrostatic shield is preferably sufficiently thin, so as to allow the inductive electric field to penetrate the shield and sustain the plasma. Unlike conventional split electrostatic shields, a longitudinal slit in the shield is not required to prevent circumferential currents in the shield and to allow power to be inductively coupled into the plasma. Rather, the fact that the shield is very thin allows power to be inductively coupled into the plasma through the shield with very little power loss. The thickness of the shield may be configured to allow a desired amount of inductively coupled power to penetrate the shield, although typically the shield is sufficiently thin such that substantially all of the inductive power penetrates the shield.

It is an advantage of these and other aspects of the present invention that capacitive power may be almost completely blocked, while inductive power is allowed to penetrate the shield virtually unimpeded. In particular, a continuous shield may be used in various embodiments without substantially blocking inductively coupled power as would be the case with a conventional continuous thick metal shield. It is a further advantage that gaps in any variety of patterns may be provided in the shield to allow a desired amount of capacitive coupling. The gaps need not be arranged in any specific relation to the source of inductively coupled power. In addition, the thickness of the shield may be selected to allow a desired amount of inductive power to penetrate the shield.

Another aspect of the present invention provides for a thin electrostatic shield that is deposited on, or forms a portion of, a plasma chamber wall. In particular embodiments, a thin layer of conductive material may be deposited directly onto a non-conductive chamber wall comprising quartz or other material substantially inert to the plasma processing environment.

It is an advantage of these and other aspects of the present invention that electrostatic shielding may be provided without a separate, bulky and expensive metal split electrostatic shield. Rather, the electrostatic shielding may be provided directly as part of the chamber wall or induction coil without the requirement of a separate stand-alone structure external to the chamber wall.

BRIEF DESCRIPTION OF THE DRAWINGS

These and other features and advantages of the present invention will become more apparent to those skilled in the art from the following detailed description in conjunction with the appended drawings in which.

DESCRIPTION

Figure 1:
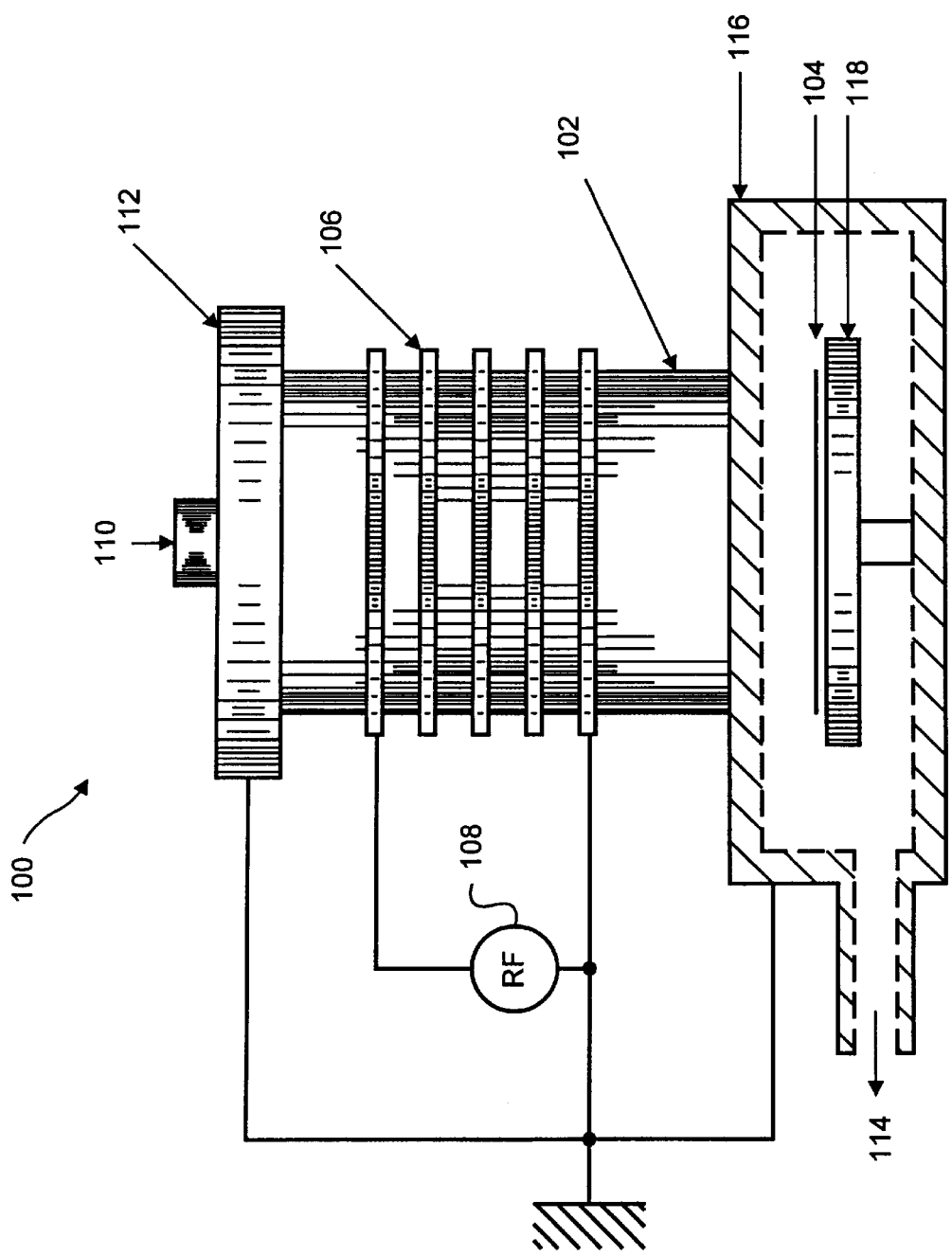
FIG. 1 is a side, partially cross-sectional view of an electrostatically shielded ICP reactor according to a first embodiment of the present invention.

One aspect of the present invention provides a thin electrostatic shield for an inductively coupled plasma source for use in plasma processing. The following description is presented to enable any person skilled in the art to make and use the invention. Descriptions of specific designs are provided only as examples. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

In the embodiments described herein, a variety of known components of inductively coupled plasma reactors and methods for processing semiconductors and other substrates may be used in conjunction with aspects of the present invention including without limitation radio frequency power sources, radio frequency powered susceptors or electromagnetically isolated susceptors, gas supply systems, gas exhaust systems, wafer transport and handling mechanisms, induction coils, plasma production chambers, processing chambers, anisotropic and isotropic etch processing, pulsed power processing as well as components and methods that may be developed in the future. Detailed descriptions of many such components and processes which may be used in conjunction with the present invention are described in U.S. Pat. No. 4,918,031, U.S. Pat. No. 5,234,529, U.S. Pat. No. 5,534,231 and International Patent Application published under the PCT as International Publication No. WO96-15545, each of which is hereby incorporated herein by reference in its entirety. In particular, a thin electrostatic shield according to the present invention may be used in place of a conventional shield in the helical resonators and other ICP reactors described in the above-referenced patents and published application.

Aspects of the present invention provide an improved electrostatic shield specifically designed for superior performance for plasma processing of semiconductors, flat panel displays or other substrates. The features of an ideal, complete electrostatic shield for inductively coupled processing include: (i) perfect opacity to electrostatic fields generated by the inductor, and (ii) perfect transparency to the inductive electromagnetic field. It has been found that a continuous, electromagnetically thin layer of conductive material between the inductor and the plasma can be used to provide virtually ideal electrostatic shielding. Note that this electromagnetically thin layer of conductive material can be physically implemented in numerous ways, as long as it is set between the inductor and the plasma.

The most straightforward way is to coat the dielectric chamber with such a material. Another way is to wrap the chamber with a dielectric film (such as Hylar or Kapton), on which the desired film has been previously deposited. Just as effective would be any structure allowing the direct wrapping of the inductor itself (instead of the dielectric chamber): one could for example provide a coaxial inductor where the core would be made of solid metal, and where the outer metal sheath (separated from the core by a dielectric sheath) would be so thin as to meet the criteria for being a thin film electrostatic shield.

An electromagnetic wave with a frequency f (e.g., an inductive field at a frequency of 13.56 MHz) is indeed absorbed exponentially with the penetration depth in a conductive material, with a characteristic distance (or skin depth) δ:

ρ being the electrical resistivity of the material. An electromagnetically thin layer can be defined, for a given electromagnetic frequency, as a film of material whose thickness is less than three times the skin depth of the material for the given frequency.

An electrostatic shield using an electromagnetically thin layer of conductive material is substantially thinner than typical conventional split electrostatic shields used in semiconductor processing. For instance, a split electrostatic shield described in International Patent Application published under the PCT as International Publication No. WO96-15545 has a width of approximately 115 thousandth of an inch (i.e., 0.002875 meters) in the section of the shield adjacent to the induction coil (which contains the slots that allow penetration of inductively coupled power). In a thin electrostatic shield according to embodiments of the present invention, the portion of the shield adjacent to the induction coil may be more than ten times thinner (e.g., less than about 250 microns) and may be in the range of, for example, from about 0.05 to about 5 microns in width.

Considering for example aluminum, the skin depth at 13.56 MHz is about 20 μm. A very straightforward calculation using this skin depth shows that if we coat the dielectric chamber wall of a typical ICP reactor with a layer of aluminum with a thickness of 0.1 μm, the inductive energy loss in this layer is expected to be less than about 0.5%.

The conductivity of the aluminum layer is sufficient, however, to remain equipotential even when parasitically coupled to the inductor. When the aluminum layer is further connected to ground (or to a solid-metal chamber body), the plasma in the enclosure of the process chamber is virtually perfectly electrostatically shielded.

Beyond the major technological advantages inherently provided by a Thin Film Electrostatic Shield (or TFES), namely a virtually perfect electrostatic shielding with almost no inductive power loss, the intrinsic simplicity of the TFES also has a tremendous industrial benefit, when compared to its complex, bulky and expensive solid-metal counterpart.

The basic concept of a thin electrostatic shield may be applied in any variety of configurations to support different types of processing. Some embodiments may, for instance: (i) provide limited open areas in the shield to ease the plasma ignition (especially for low power operation); (ii) provide a shield divided into several electrically independent sectors that can be independently grounded, or biased; (iii) provide mechanisms for adjusting the level of capacitive coupling of some sectors during the process (for instance by providing an elevational or rotational actuator for lifting portions of the shield or moving them apart to provide gaps that allow conductive coupling); or (iv) provide different thickness in different areas, e.g. for the purpose of controlling power distribution throughout the chamber. It should also be noted that at embodiments of a thin electrostatic shield may be useful for fields other than plasma processing. For thermal processing under vacuum (frequency typically <100 kHz), for example, a thin electrostatic shield may be used to prevent the ignition of an undesired plasma.

FIG. 1 is a side, partially cross-sectional view of an exemplary electrostatically shielded ICP reactor, generally indicated at 100, according to a first embodiment of the present invention. In the first embodiment, a dielectric vessel 102 forms a plasma chamber within which a plasma is produced for processing a semiconductor wafer 104 or other substrate. The dielectric vessel 102 in the first embodiment comprises quartz or alumina on which a thin electrostatic shield is deposited. An inductor 106 is provided adjacent to the plasma chamber to inductively couple power into the plasma in the plasma chamber. In the first embodiment, the inductor 106 comprises a helical coil surrounding the dielectric vessel 102. Of course, other inductors may be used in other embodiments, including without limitation, helical resonator coils, spiral coils in a flat plane or cone next or above the plasma chamber, or other inductors for inductively coupling power into the plasma chamber. A power source 108 provides radio frequency power to the inductor at a desired frequency. In the first embodiment, frequencies in the range of from about 0.1 MHz to about 40.68 MHz (or any range subsumed therein) might be used depending upon the desired processing, with a frequency of 13.56 MHz typically being used. In the first embodiment, gas is provided from a conventional gas source and is injected into the plasma chamber through a gas inlet 110 formed in the top of the chamber 112. Gas is exhausted from the reactor through a gas exhaust 114 which is coupled to a pump or other conventional exhaust system. Below the plasma chamber is a processing chamber 116 in which is contained a wafer 104 for processing. A susceptor 118 provides a support for the wafer. The susceptor may be isolated from ground or may be biased with RF power or other electric or magnetic field to attract or repel ions in a controllable manner.

In the first embodiment, RF power is inductively coupled into the gas in the plasma chamber to form a plasma. The plasma contains plasma products including ions, dissociated atoms and excited molecules. The wafer may be exposed to selected plasma products for processing. For instance, ions may be accelerated toward the wafer for anisotropic etching. Alternatively, ions may not be accelerated toward the wafer (and may in fact be repelled or filtered) and dissociated atoms may be used for isotropic ashing. Any variety of other processes may be performed as well.

In the first embodiment, a thin film electrostatic shield is deposited on the dielectric vessel to shield against parasitic capacitance from the inductor 106. In the first embodiment, the shield comprises a thin layer of material with a conductivity sufficient to substantially block capacitive coupling through the material when the shield is grounded or held at some desired potential. In the first embodiment, a low impedance path for the given power frequency is provided between the shield and ground. In particular, the shield is electrically connected to the chamber top and processing chamber walls which are grounded. The shield may also be grounded in additional locations to prevent voltage differences from appearing along the body of the shield. In the first embodiment, the conductivity of the material used to form the shield is preferably less than about 1 Ωcm. An exemplary shield for the first embodiment comprises a thin film of aluminum or titanium nitride (which provides better mechanical resistance) with a thickness in the range of about one hundredth of a micron to about 60 microns (or any range subsumed therein) and a preferred thickness in the range of about 0.1 micron to about 5 microns. The aluminum film may be deposited directly on the external dielectric vessel wall using conventional deposition techniques. As described above, this shield substantially blocks capacitive coupling of the inductor to the plasma, while allowing inductive power to penetrate the shield and sustain the plasma in the plasma chamber.

Figure 2:
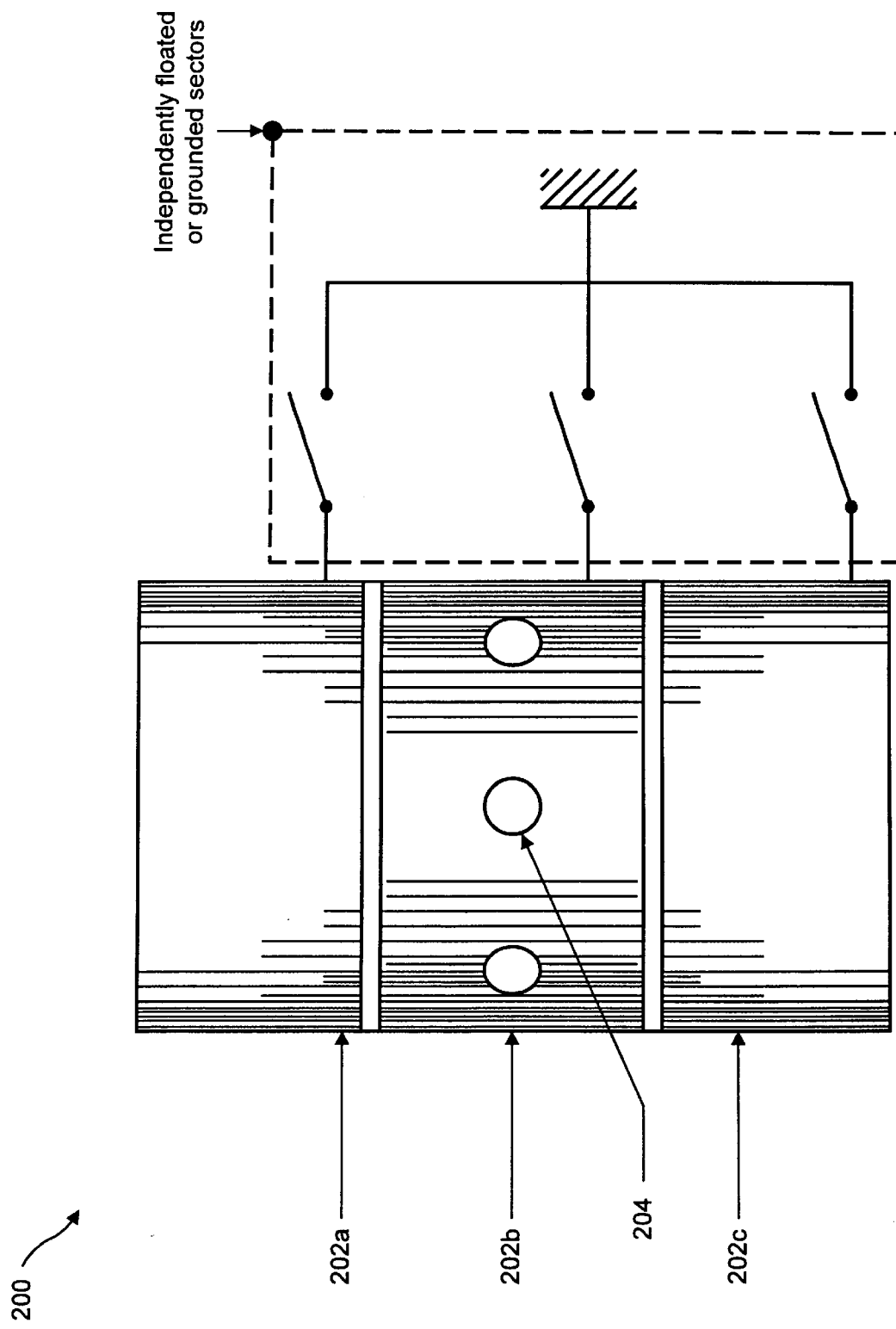
FIG. 2 is a side view of an electrostatic shield according to a second embodiment of the present invention.

FIG. 2 is a side view of an electrostatic shield, generally indicated at 200, according to a second embodiment of the present invention. As in the first embodiment, the electrostatic shield may comprise a thin film of around 0.1–5 μm of aluminum or titanium nitride (better mechanical resistance) deposited on a dielectric vessel. In the second embodiment, however, the shield is divided into three electrically independent sectors 202a, b and c, each of substantially the same height. Each sector may be independently grounded or left electrically floating which provides more control over generating and sustaining the plasma and in turn more process flexibility. The second embodiment also contains 4–6 small, circular unshielded areas 204 formed in the thin film coating (diameter≈10 mm) evenly distributed at around ⅔ the height of vessel. Such unshielded gaps may be used to allow a controlled amount of capacitive coupling which makes it easier to ignite a plasma at low power.

Of course any variety of configurations may be used to control plasma characteristics. Capacitive coupling in different areas of the plasma may be controlled by providing either shielding or unshielded gaps in desired locations. Inductive coupling may be controlled by adjusting the power source or by varying the thickness of the shield in desired locations such that the shield absorbs some amount of inductive power. In some embodiments, if power is absorbed by the shield, the shield may have to be cooled. Water cooling or other conventional cooling mechanisms may be used for this purpose.

Figure 3A:
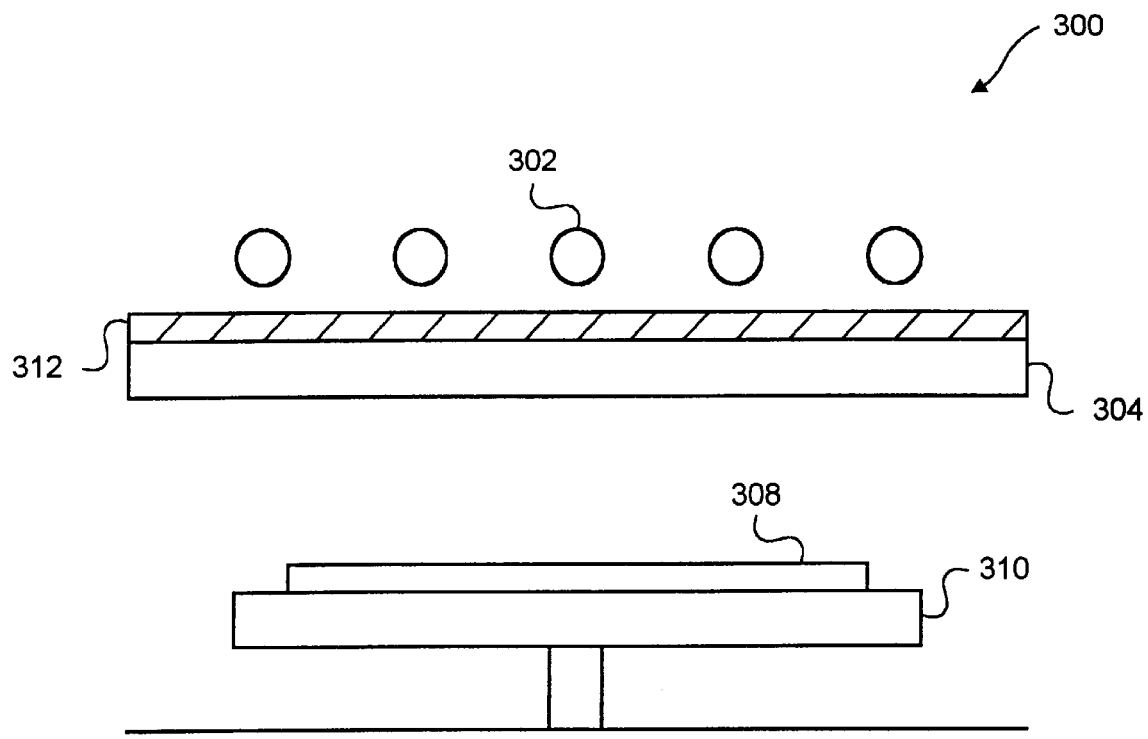
FIG. 3A is a side, cross-sectional view of an electrostatically shielded ICP reactor according to a third embodiment of the present invention.
Figure 3B:
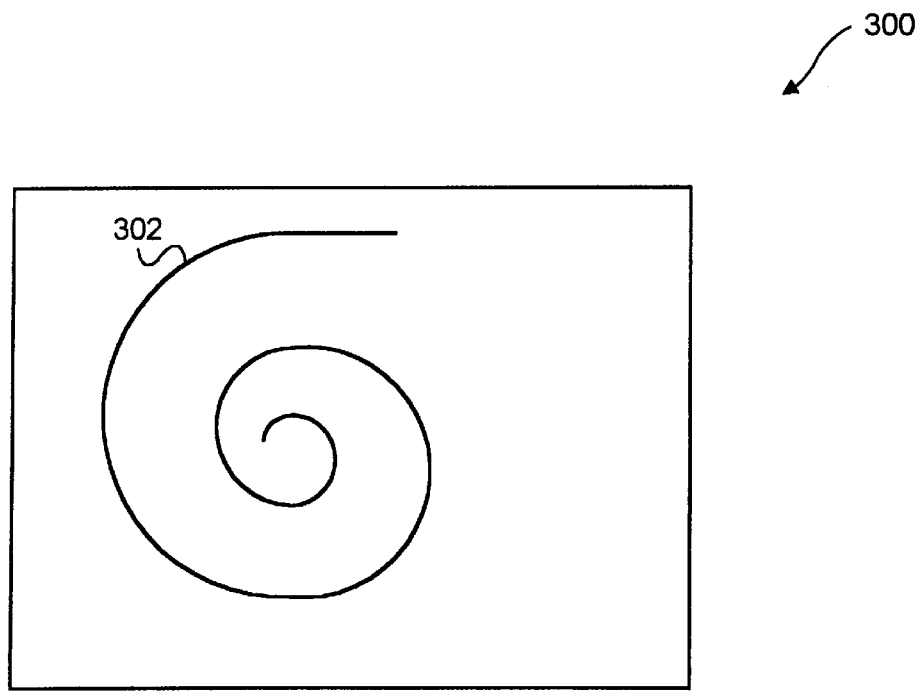
FIG. 3B is a top view of an electrostatically shielded ICP reactor according to the third embodiment of the present invention.

FIG. 3A is a side, cross-sectional view, and FIG. 3B is a top view, of an electrostatically shielded ICP reactor, generally indicated at 300, according to a third embodiment of the present invention. In the third embodiment, the inductor 302 is in a flat or "pancake" configuration. The inductor is adjacent to a top dielectric wall 304 of the reactor and forms a spiral as shown in FIG. 3B (although other configurations may be used to inductively couple power into such a flat reactor configuration as well). The inductor inductively couples power into a plasma processing chamber 306 to form a plasma. A wafer 308 or other substrate is supported in the plasma processing chamber on a susceptor 310 for processing. A thin electrostatic shield 312 is provided between the inductor and the plasma to block parasitic capacitance as in the embodiments described above. In the third embodiment, a thin layer of aluminum or titanium nitride with a thickness of from about 0.1 micron to about 5 microns may be deposited directly onto the external surface of the top dielectric wall of the reactor.

It will be readily apparent to those of ordinary skill in the art that the above techniques may be applied in any variety of inductively coupled processing systems and methods.

While this invention has been described and illustrated with reference to particular embodiments, the scope of the present invention is not limited to the disclosed embodiments but, on the contrary, is intended to cover numerous other modifications and equivalent arrangements which are included within the spirit and scope of the following claims.

What is claimed is:

1. A plasma reactor comprising:

a chamber wall forming a plasma chamber within which a plasma is produced, the plasma including at least one plasma product for processing;

a source of radio frequency power for providing power at a processing frequency;

an inductor adjacent to the plasma chamber and coupled to the source of radio frequency power to inductively couple power into the plasma chamber;

a gas inlet for providing gas into the plasma chamber;

a gas exhaust for exhausting gas from the plasma chamber;

a shield positioned between at least a portion of the inductor and at least a portion of the plasma such that the shield reduces capacitive coupling from the inductor to the plasma relative to a level of capacitive coupling that would be present in the absence of the shield; and wherein at least a portion of the shield has a resistivity of less than about 1 Ωcm and a thickness less than one fourth of the skin depth at the processing frequency such that inductively coupled power from the inductor is coupled through the shield to sustain the plasma.

2. The plasma reactor according to claim 1, wherein the shield comprises a thin film having a thickness of less than about 0.1 microns.

3. The plasma reactor according to claim 1, wherein the shield comprises a thin film having a thickness of less than about 5 microns.

4. The plasma reactor according to claim 1, wherein the shield comprises a conductive material.

5. The plasma reactor according to claim 4, wherein the shield comprises aluminum.

6. The plasma reactor according to claim 1, wherein the shield is deposited on at least a portion of the chamber wall.

7. The plasma reactor according to claim 6, wherein the chamber wall is non-conductive, comprising an electrically resistive material having a resistivity greater than about 1 Ωcm.

8. The plasma reactor of claim 7, wherein the shield substantially covers the electrically resistive material of the chamber wall.

9. The plasma reactor according to claim 1, wherein the shield comprises a plurality of regions each having a different thickness.

10. The plasma reactor according to claim 1, wherein the shield forms a plurality of substantially non-conductive gaps such that the shield includes a plurality of conductive sectors electrically isolated from one another.

11. The plasma reactor according to claim 10, wherein at least one of the conductive sectors is electrically coupled to a ground potential.

12. The plasma reactor according to claim 10, wherein at least one of the conductive sectors is electrically coupled to a power supply.

13. The plasma reactor according to claim 1, wherein the inductor comprises a helical resonator.

14. The plasma reactor according to claim 1, wherein
the inductor includes a conductive core; and
the shield comprises a thin film deposited around at least a portion of the inductor and is isolated from the conductive core.

15. The plasma reactor according to claim 1, wherein the shield comprises a thin film deposited on the chamber wall.

16. The plasma reactor according to claim 1, wherein
the inductor generates an inductive electric field;
the shield is configured such that there is a continuous path along the shield in the direction of the inductive electric field; and
a portion of the shield along the continuous path is sufficiently thin to prevent a countervailing current from being formed which would substantially reduce inductive coupling from the inductor to the plasma.

17. The plasma reactor according to claim 1, wherein the shield provides a continuous shield body along the shielded portion of the process chamber.

18. The plasma reactor according to claim 1, wherein a substrate is positioned such that the substrate is exposed to the at least one plasma product for processing.

19. A method of processing in a plasma reactor comprising the steps of:
supplying gas to a reaction chamber;
forming at least one plasma product for processing;
providing radio frequency power at a processing frequency;
shielding the gas in the reaction chamber with a shield, the shield having a resistivity of less than about 1 Ωcm and a thickness less than one fourth of the skin depth at the processing frequency;
inductively coupling power at the processing frequency into the gas in the reaction chamber through said shield.

20. The method of claim 19 further comprising:
generating an inductive electric field, the electrostatic shield configured such that there is a continuous path along the shield in the direction of the inductive electric field and a portion of the shield along the continuous path is sufficiently thin to prevent a countervailing current from being formed which would substantially reduce inductive coupling from the inductor to the plasma.

21. The method of claim 19, wherein the shield comprises a conductive material.

22. The method of claim 20, wherein the shield comprises aluminum.

23. The method of claim 19, wherein the shield comprises a thin film.

24. The method of claim 23, wherein the shield comprises a thin film deposited on an inductor.

25. The method of claim 23, wherein the shield comprises a thin film deposited on the reaction chamber.

26. The method of claim 23, wherein the shield has a thickness of less than about 5 microns.

27. The method of claim 23, wherein the shield has a thickness of less than about 0.1 microns.

28. The method of claim 19, further comprising the step of exposing the substrate to the at least one plasma product for processing.

* * * * *